United States Patent
Yoshida et al.

(10) Patent No.: US 10,991,575 B2
(45) Date of Patent: Apr. 27, 2021

(54) SEMICONDUCTOR DEVICE WITH PARTIAL REGIONS HAVING IMPUNITY CONCENTRATIONS SELECTED TO OBTAIN A HIGH THRESHOLD VOLTAGE

(71) Applicant: Kabushiki Kaisha Toshiba, Minato-ku (JP)

(72) Inventors: Hisashi Yoshida, Kawasaki (JP); Shigeya Kimura, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 16/558,504

(22) Filed: Sep. 3, 2019

(65) Prior Publication Data

US 2020/0144055 A1    May 7, 2020

(30) Foreign Application Priority Data

Nov. 6, 2018  (JP) .............................. JP2018-209079

(51) Int. Cl.
  *H01L 21/02*  (2006.01)
  *C30B 29/40*  (2006.01)
(52) U.S. Cl.
  CPC ...... *H01L 21/02447* (2013.01); *C30B 29/406* (2013.01); *H01L 21/02378* (2013.01); *H01L 21/02458* (2013.01); *H01L 21/02502* (2013.01)
(58) Field of Classification Search
  CPC ......... H01L 29/66431; H01L 29/66462; H01L 21/02458; H01L 21/02502;
  (Continued)

(56) References Cited

U.S. PATENT DOCUMENTS 7,625,447 B2    12/2009  Suda et al.
2005/0082569 A1*  4/2005  Toyama .............. H01L 29/7785
                                                                                                     257/192
(Continued)

FOREIGN PATENT DOCUMENTS

JP    WO2004/084283 A1    9/2004
JP    WO2008/123213 A1    10/2008
(Continued)

OTHER PUBLICATIONS

Shen, Z, et al., "Prediction of High-Density and High Mobility Two-Dimensional Electron Gas at $Al_xGa_{1-x}N$/4H-SiC Interface", Materials Science Forum, Submitted Sep. 10, 2016, ISSN: 1662-9752, vol. 897, pp. 719-722.

*Primary Examiner* — Shahed Ahmed
(74) *Attorney, Agent, or Firm* — Oblon, McClelland, Maier & Neustadt, L.L.P.

(57) ABSTRACT

According to one embodiment, a semiconductor device includes first to third electrodes, and first and second layers. A direction from the first electrode toward the second electrode is aligned with a first direction. A position in the first direction of the third electrode is between positions in the first direction of the first and second electrodes. The first layer includes at least one selected from the group consisting of silicon carbide, silicon, carbon, and germanium. The first layer includes first to sixth partial regions. A concentration of the first impurity in the fourth partial region is higher than a concentration of the first impurity in the fifth partial region and higher than a concentration of the first impurity in the sixth partial region. The second layer includes $Al_xGa_{1-x}N$ ($0<x\leq1$). The second layer includes a first portion and a second portion.

20 Claims, 8 Drawing Sheets (58) Field of Classification Search
CPC ......... H01L 21/02447; H01L 21/02378; H01L 2924/13064; H01L 29/778–7789; H01L 29/122–127; H01L 29/15–158; H01L 29/4236; H01L 29/0623; H01L 29/1602; H01L 29/32; H01L 29/045; H01L 29/1045; H01L 29/1608; H01L 29/267; H01L 29/2003; H01L 29/7786; C30B 29/406

See application file for complete search history.

(56) References Cited

U.S. PATENT DOCUMENTS

| | | | |
|---|---|---|---|
| 2006/0214187 A1* | 9/2006 | Mita | H01L 29/7787 257/194 |
| 2009/0050938 A1* | 2/2009 | Miyoshi | H01L 29/7787 257/194 |
| 2010/0072485 A1 | 3/2010 | Suda et al. | |
| 2014/0091364 A1* | 4/2014 | Imanishi | H01L 29/66431 257/194 |
| 2018/0308925 A1* | 10/2018 | Chen | H01L 29/1045 |
| 2019/0207018 A1* | 7/2019 | Makiyama | H01L 29/66462 |
| 2020/0144393 A1* | 5/2020 | Kitano | H01L 29/0653 |

FOREIGN PATENT DOCUMENTS

| | | |
|---|---|---|
| JP | 2009-147264 A | 7/2009 |
| JP | 5207874 B2 | 6/2013 |

\* cited by examiner

SEMICONDUCTOR DEVICE WITH PARTIAL REGIONS HAVING IMPUNITY CONCENTRATIONS SELECTED TO OBTAIN A HIGH THRESHOLD VOLTAGE

CROSS-REFERENCE TO RELATED APPLICATIONS

This application is based upon and claims the benefit of priority from Japanese Patent Application No. 2018-209079, filed on Nov. 6, 2018; the entire contents of which are incorporated herein by reference.

FIELD

Embodiments described herein relate generally to a semiconductor device.

BACKGROUND

For example, there is a semiconductor device such as a HEMT or the like. It is desirable to improve the characteristics of the semiconductor device.

DETAILED DESCRIPTION

According to one embodiment, a semiconductor device includes first to third electrodes, and first and second layers. A direction from the first electrode toward the second electrode is aligned with a first direction. A position in the first direction of the third electrode is between a position in the first direction of the first electrode and a position in the first direction of the second electrode. The first layer includes at least one selected from the group consisting of silicon carbide, silicon, carbon, and germanium. The first layer includes first to sixth partial regions. A direction from the first partial region toward the first electrode, a direction from the second partial region toward the second electrode, and a direction from the third partial region toward the third electrode are aligned with a second direction crossing the first direction. The fourth partial region is between the third partial region and the third electrode in the second direction. A position in the first direction of the fifth partial region is between a position in the first direction of the first partial region and a position in the first direction of the fourth partial region. A position in the first direction of the sixth partial region is between the position in the first direction of the fourth partial region and a position in the first direction of the second partial region. A concentration of the first impurity in the fourth partial region is higher than a concentration of the first impurity in the fifth partial region and higher than a concentration of the first impurity in the sixth partial region. The second layer includes $Al_xGa_{1-x}N$ (0<x1). The second layer includes a first portion and a second portion. A direction from the fifth partial region toward the first portion and a direction from the sixth partial region toward the second portion are aligned with the second direction.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

Figure 1A:
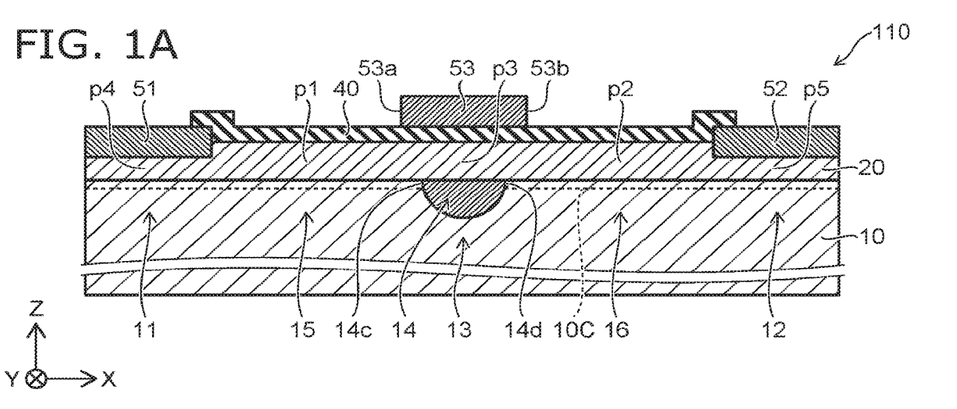
FIG. 1A to FIG. 1C are schematic cross-sectional views illustrating semiconductor devices according to a first embodiment.
Figure 1B:
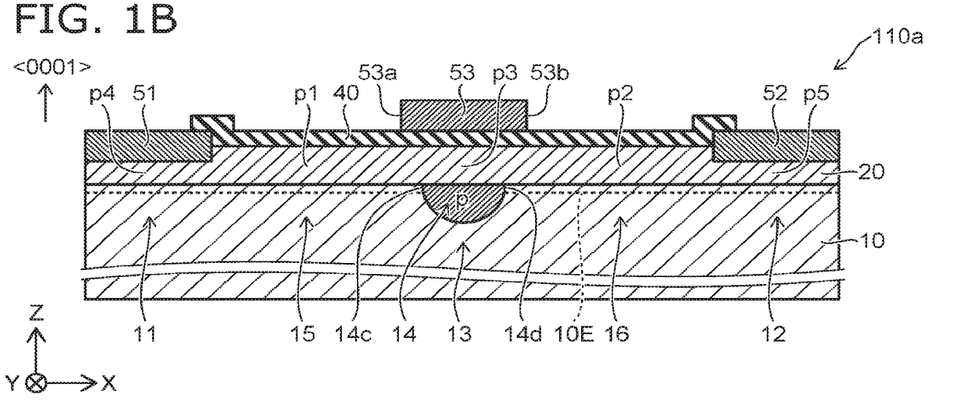
Figure 1C:
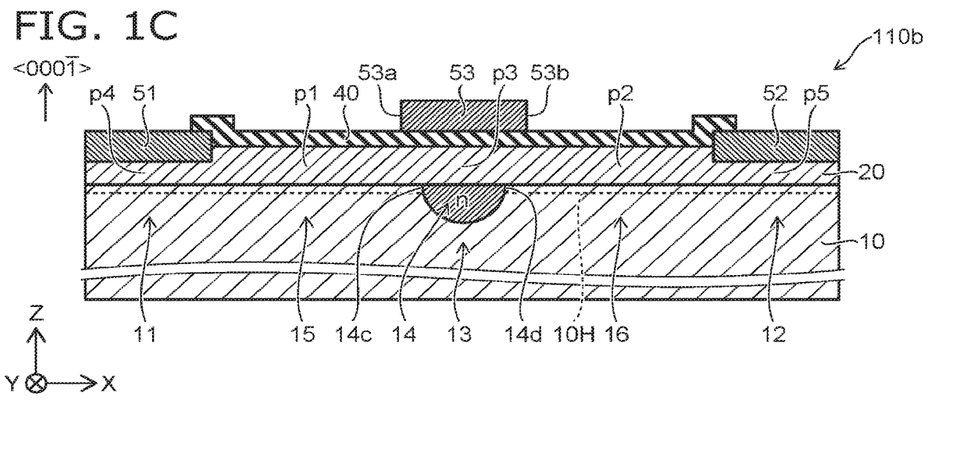

FIG. 1A to FIG. 1C are schematic cross-sectional views illustrating semiconductor devices according to a first embodiment.

As shown in FIG. 1A to FIG. 1C, semiconductor devices 110, 110a, and 110b according to the first embodiment include a first electrode 51, a second electrode 52, a third electrode 53, a first layer 10, and a second layer 20. In these examples, these semiconductor devices further include an insulating portion 40.

The direction from the first electrode 51 toward the second electrode 52 is aligned with a first direction. The first direction is taken as an X-axis direction. One direction perpendicular to the X-axis direction is taken as a Z-axis direction. A direction perpendicular to the X-axis direction and the Z-axis direction is taken as a Y-axis direction.

The position in the first direction (the X-axis direction) of the third electrode 53 is between the position in the first direction of the first electrode 51 and the position in the first direction of the second electrode 52. For example, the third electrode 53 is between the first electrode 51 and the second electrode 52 in the X-axis direction.

The first layer 10 includes, for example, at least one selected from the group consisting of silicon carbide (SiC), silicon, carbon, and germanium. When the first layer 10 includes SiC, the SiC includes, for example, at least one selected from the group consisting of 6H—SiC, 4H—SiC, and 3C—SiC. For example, the first layer 10 includes a crystal. The first layer 10 may include, for example, diamond.

The first layer 10 includes, for example, a Group IV semiconductor.

The first layer 10 includes first to sixth partial regions 11 to 16. The direction from the first partial region 11 toward the first electrode 51 is aligned with a second direction. The second direction crosses the first direction (the X-axis direction). For example, the second direction is the Z-axis direction.

The direction from the second partial region 12 toward the second electrode 52 is aligned with the second direction (e.g., the Z-axis direction). The direction from the third partial region 13 toward the third electrode 53 is aligned with the second direction (e.g., the Z-axis direction).

The fourth partial region 14 is between the third partial region 13 and the third electrode 53 in the second direction (e.g., the Z-axis direction).

The position in the first direction (the X-axis direction) of the fifth partial region 15 is between the position in the first direction of the first partial region 11 and the position in the first direction of the fourth partial region 14.

The position in the first direction (the X-axis direction) of the sixth partial region 16 is between the position in the first direction of the fourth partial region 14 and the position in the first direction of the second partial region 12.

The second layer 20 includes $Al_xGa_{1-x}N$ (0<x≤1). The second layer 20 includes a first portion p1 and a second portion p2. The direction from the fifth partial region 15 toward the first portion p1 is aligned with the second direction (e.g., the Z-axis direction) recited above. The direction from the sixth partial region 16 toward the second portion p2 is aligned with the second direction.

The composition ratio x of Al recited above is, for example, 0.5 or more. The second layer 20 includes, for example, AlN.

The second layer 20 includes a polar semiconductor. The bandgap of the second layer 20 is larger than the bandgap of the first layer 10.

For example, the first portion p1 contacts the fifth partial region 15. The second portion p2 contacts the sixth partial region 16.

In the example, the second layer 20 further includes a third portion p3. The third portion p3 is between the fourth partial region 14 and the third electrode 53 in the second direction (e.g., the Z-axis direction).

The insulating portion 40 is provided between the second layer 20 and the third electrode 53. For example, the insulating portion 40 is provided between the third portion p3 and the third electrode 53.

The insulating portion 40 includes, for example, at least one element selected from the group consisting of silicon, aluminum, boron, and hafnium and at least one element selected from the group consisting of oxygen and nitrogen. The insulating portion 40 includes, for example, at least one selected from the group consisting of silicon oxide, silicon oxynitride, silicon nitride, aluminum oxide, aluminum oxynitride, aluminum nitride, boron nitride, and hafnium oxide. The insulating portion 40 electrically insulates the third electrode 53 and the second layer 20.

The insulating portion 40 may be provided in the region between the first electrode 51 and the third electrode 53 and in the region between the second electrode 52 and the third electrode 53. The first portion p1 is provided between the insulating portion 40 and the fifth partial region 15. The second portion p2 is provided between the insulating portion 40 and the sixth partial region 16.

As shown in FIG. 1A, for example, a carrier region 10C is formed in the semiconductor device 110. For example, the carrier region 10C is formed in a region of the fifth partial region 15 on the first portion p1 side and in a region of the sixth partial region 16 on the second portion p2 side.

For example, in the semiconductor device 110a as shown in FIG. 1B, the orientation from the fifth partial region 15 toward the first portion p1 is aligned with the <0001> direction of the second layer 20. In such a case, the carrier region includes, for example, a two-dimensional electron gas 10E.

For example, in the semiconductor device 110b as shown in FIG. 1C, the orientation from the fifth partial region 15 toward the first portion p1 is aligned with the <000-1> direction of the second layer 20. In such a case, the carrier region includes, for example, a two-dimensional hole gas 10H. The "–" in the description of the directions recited above denotes a bar (referring to FIG. 1C).

In the semiconductor devices 110, 110a, and 110b, for example, the first electrode 51 functions as a source electrode. For example, the second electrode 52 functions as a drain electrode. For example, the third electrode 53 functions as a gate electrode. The semiconductor device 110 is, for example, a HEMT (High Electron Mobility Transistor). Or, the semiconductor device 110 is, for example, a HHMT (High Hole Mobility Transistor). The semiconductor device 110a is, for example, a HEMT. The semiconductor device 110b is a HHMT.

In the embodiment, the concentration of a first impurity in the fourth partial region 14 is higher than the concentration of the first impurity in the fifth partial region 15 and higher than the concentration of the first impurity in the sixth partial region 16.

Thus, in the embodiment, the impurity concentration is high locally. The threshold voltage is moderately high thereby. For example, a normally-OFF operation is obtained.

In the embodiment, the impurity concentration is low in the fifth partial region 15 and the sixth partial region 16 where the carrier region 10C is formed. A high mobility is obtained thereby. According to the embodiment, a semiconductor device can be provided in which the characteristics can be improved.

In the embodiment, when the orientation from the fifth partial region 15 toward the first portion p1 is aligned with the <0001> direction (referring to FIG. 1B), it is favorable for the first impurity to include at least one selected from the group consisting of B, Al, and Ga. These elements function as a p-type impurity. In such a case, the fourth partial region 14 is a p-type region.

When the orientation from the fifth partial region 15 toward the first portion p1 is aligned with the <0001> direction, the two-dimensional electron gas 10E is generated by spontaneous polarization, piezoelectric polarization, etc. In such a case, by providing the fourth partial region 14 including the p-type impurity, the generation of the two-dimensional electron gas 10E is suppressed in the fourth partial region 14. For example, the electron concentration decreases locally due to the p-type impurity. Thereby, when OFF, carriers are substantially not generated in the portion under the third electrode 53. Normally-OFF characteristics are obtained thereby. By applying a voltage (the gate voltage) to the third electrode 53, electrons are attracted into the portion under the third electrode 53 (e.g., the fourth partial region 14); a current flows between the first electrode 51 and the second electrode 52; and the state is set to the ON-state.

On the other hand, in the embodiment, when the orientation from the fifth partial region 15 toward the first portion p1 is aligned with the <000-1> direction (referring to FIG. 1C), it is favorable for the first impurity to include at least one selected from the group consisting of N, P, and As. These elements function as an n-type impurity. In such a case, the fourth partial region 14 is an n-type region.

When the orientation from the fifth partial region 15 toward the first portion p1 is aligned with the <000-1> direction, the two-dimensional hole gas 10H is generated by spontaneous polarization, piezoelectric polarization, etc. At this time, by providing the fourth partial region 14 including the n-type impurity, the generation of the two-dimensional hole gas 10H is suppressed in the fourth partial region 14. For example, the hole concentration decreases locally due to the n-type impurity. Thereby, when OFF, carriers are substantially not generated in the portion under the third electrode 53. Normally-OFF characteristics are obtained thereby. By applying a voltage (the gate voltage) to the third electrode 53, holes are attracted into the portion under the third electrode 53 (e.g., the fourth partial region 14); a current flows between the first electrode 51 and the second electrode 52; and the state is set to the ON-state.

In the embodiment, for example, the concentration of the first impurity in the fourth partial region 14 is higher than the concentration of the first impurity in the third partial region 13.

For example, a region where the first impurity is high locally can be formed in the semiconductor layer used to form the first layer 10 by locally ion-implanting the first impurity.

In the embodiment, the fourth partial region 14 may include a p-type impurity and an n-type impurity. For example, when the orientation from the fifth partial region 15 toward the first portion p1 is aligned with the <0001> direction, the concentration of the p-type impurity is higher than the concentration of the n-type impurity. For example, when the orientation from the fifth partial region 15 toward the first portion p1 is aligned with the <000-1> direction, the concentration of the n-type impurity is higher than the concentration of the p-type impurity.

In the embodiment, the fourth partial region 14 may include another element in addition to the first impurity. The other element may include, for example, Ar, etc. For example, the crystallinity in the fourth partial region 14 can be adjusted. For example, the threshold voltage can be adjusted.

In the embodiment, the crystallinity in the fourth partial region 14 may be low locally. For example, the crystallinity in the fourth partial region 14 is lower than the crystallinity in the fifth partial region 15 and lower than the crystallinity in the sixth partial region 16.

For example, the crystallinity is high in the fifth partial region 15 and the sixth partial region 16. Thereby, when ON, a high mobility is obtained. By setting the crystallinity in the fourth partial region 14 to be low, for example, the threshold voltage can be adjusted to be a moderate value.

When operating, the fourth partial region 14 is a resistance component. Therefore, it is favorable for the width (the length along the X-axis direction) of the fourth partial region 14 to be narrow. For example, the width of the fourth partial region 14 is narrower than the width of the third electrode 53.

The third electrode 53 includes a first end portion 53a and a second end portion 53b. The position in the first direction (the X-axis direction) of the first end portion 53a is between the position in the first direction of the first electrode 51 and the position in the first direction of the second end portion 53b. The position in the first direction (the X-axis direction) of the second end portion 53b is between the position in the first direction of the second electrode 52 and the position in the first direction of the first end portion 53a. The first end portion 53a is the end portion on the first electrode 51 side. The second end portion 53b is the end portion on the second electrode 52 side.

The fourth partial region 14 includes a third end portion 14c and a fourth end portion 14d. The position in the first direction (the X-axis direction) of the third end portion 14c is between the position in the first direction of the first electrode 51 and the position in the first direction of the fourth end portion 14d. The position in the first direction (the X-axis direction) of the fourth end portion 14d is between the position in the first direction of the second electrode 52 and the position in the first direction of the third end portion 14c. The third end portion 14c is the end portion on the first electrode 51 side. The fourth end portion 146d is the end portion on the second electrode 52 side.

The position in the first direction (the X-axis direction) of the first end portion 53a is between the position in the first direction of the first electrode 51 and the position in the first direction of the third end portion 14c. The position in the first direction (the X-axis direction) of the second end portion 53b is between the position in the first direction of the second electrode 52 and the position in the first direction of the fourth end portion 14d.

For example, the distance along the X-axis direction between the first end portion 53a and the second end portion 53b corresponds to the width of the third electrode 53. In one example, the width of the third electrode 53 is not less than 0.5 μm and not more than 10 μm. For example, the distance along the X-axis direction between the third end portion 14c and the fourth end portion 14d corresponds to the width of the fourth partial region 14. The width of the fourth partial region 14 is not less than 0.01 times but less than 1 times the width of the third electrode 53.

For example, the distance along the X-axis direction between the first end portion 53a and the third end portion 14c exceeds 0 μm and is not more than 4.95 μm. The distance along the X-axis direction between the second end portion 53b and the fourth end portion 14d exceeds 0 μm and is not more than 4.95 μm.

For example, the distance along the X-axis direction between the first end portion 53a and the third end portion 14c exceeds 0 times and is not more than 0.495 times the distance along the X-axis direction between the first end portion 53a and the second end portion 53b. The distance along the X-axis direction between the second end portion 53b and the fourth end portion 14d exceeds 0 times and is not more than 0.495 times the distance along the X-axis direction between the first end portion 53a and the second end portion 53b.

In the example, the first electrode 51 and the second electrode 52 are respectively electrically connected to the first partial region 11 and the second partial region 12 via the second layer 20. For example, the second layer 20 includes a fourth portion p4 and a fifth portion p5. The fourth portion p4 is provided between the first partial region 11 and the first electrode 51 in the second direction (e.g., the Z-axis direction). The fifth portion p5 is provided between the second partial region 12 and the second electrode 52 in the second direction.

As described below, the first electrode 51 may be electrically connected to the first partial region 11 without the second layer 20 being interposed. As described below, the second electrode 52 may be electrically connected to the second partial region 12 without the second layer 20 being interposed.

For example, a reference example may be considered in which the entire first layer 10 includes a p-type or n-type impurity. The fifth partial region 15 and the sixth partial region 16 are not provided in the reference example. In such a case, the mobility decreases because all of the regions where the carrier region 10C is formed include an impurity.

In the embodiment, the concentration of the first impurity in the fifth partial region 15 is, for example, $1 \times 10^{15}$ cm$^{-3}$ or less. The concentration of the first impurity in the sixth partial region 16 is, for example, $1 \times 10^{15}$ cm$^{-3}$ or less.

In the embodiment, the concentration of the first impurity in the fourth partial region 14 is, for example, $1 \times 10^{15}$ cm$^{-3}$ or more. The concentration of the first impurity in the fourth partial region 14 is, for example, not more than $1 \times 10^{17}$ cm$^{-3}$.

Several examples of the semiconductor device according to the embodiment will now be described.

Figure 2A:
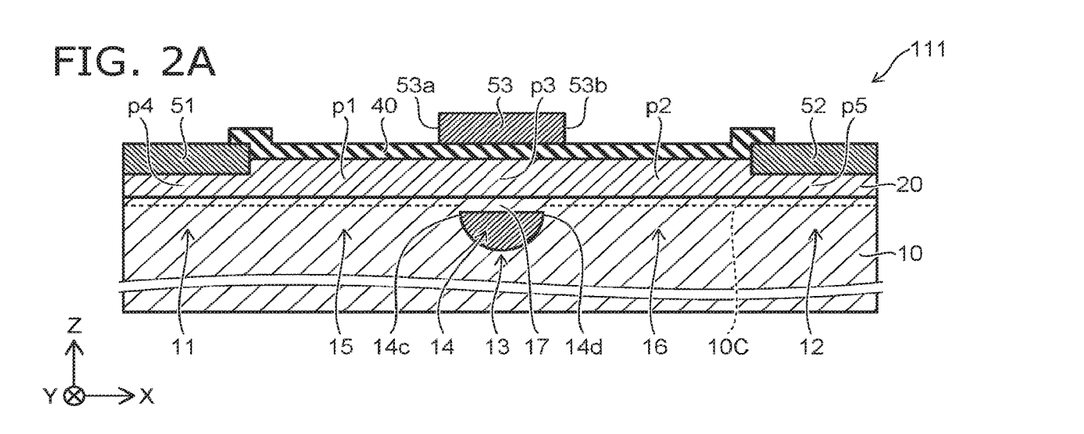
FIG. 2A to FIG. 2C are schematic cross-sectional views illustrating semiconductor devices according to the first embodiment.
Figure 2B:
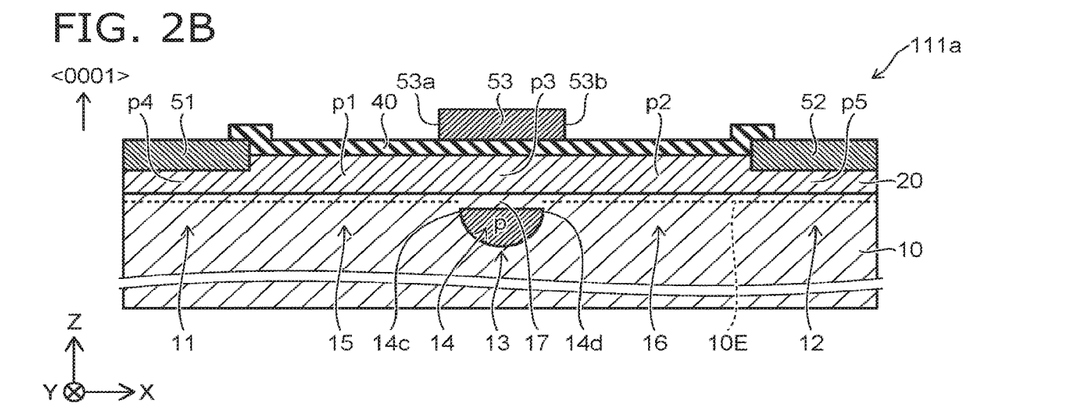
Figure 2C:
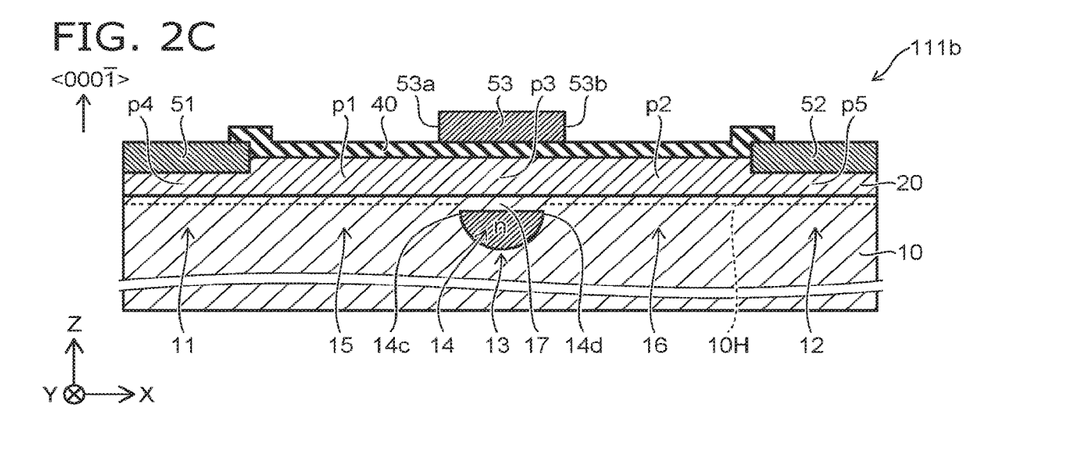

FIG. 2A to FIG. 2C are schematic cross-sectional views illustrating semiconductor devices according to the first embodiment.

As shown in FIG. 2A to FIG. 2C, semiconductor devices 111, 111a, and 111b according to the first embodiment also include the first electrode 51, the second electrode 52, the third electrode 53, the first layer 10, the second layer 20, and the insulating portion 40. In the semiconductor devices 111, 111a, and 111b, the first layer further includes a seventh partial region 17 in addition to the first to sixth partial regions 11 to 16. Otherwise, the configurations of these semiconductor devices are similar to the configurations of the semiconductor devices 110, 110a, and 110b. Examples of the seventh partial region 17 will now be described.

The seventh partial region 17 is provided between the fourth partial region 14 and the third electrode 53 in the second direction (e.g., the Z-axis direction). The concentration of the first impurity in the seventh partial region 17 is lower than the concentration of the first impurity in the fourth partial region 14.

As described above, for example, the fourth partial region 14 is formed by ion-implanting the first impurity locally into the semiconductor layer used to form a portion of the first layer 10. Subsequently, the seventh partial region 17 is formed by epitaxially growing a semiconductor layer used to form another portion of the first layer 10. At least a portion of the fifth partial region 15 and at least a portion of the sixth partial region 16 may be formed by the epitaxial growth (the regrowth).

In the semiconductor devices 111, 111a, and 111b, the carrier region 10C (the two-dimensional electron gas 10E or the two-dimensional hole gas 10H) is suppressed locally by the first impurity at the portion under the third electrode 53. Good crystallinity is obtained in the seventh partial region 17. Therefore, a higher mobility is obtained easily.

The length (the thickness) along the Z-axis direction of the seventh partial region 17 is, for example, not less than 1 nm and not more than 500 nm. Thereby, for example, a higher mobility is obtained easily.

Figure 3A:
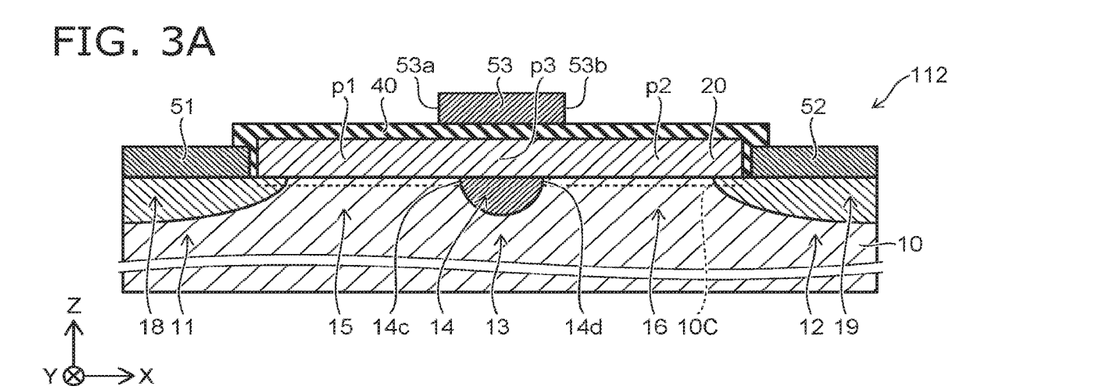
FIG. 3A to FIG. 3C are schematic cross-sectional views illustrating semiconductor devices according to the first embodiment.
Figure 3B:
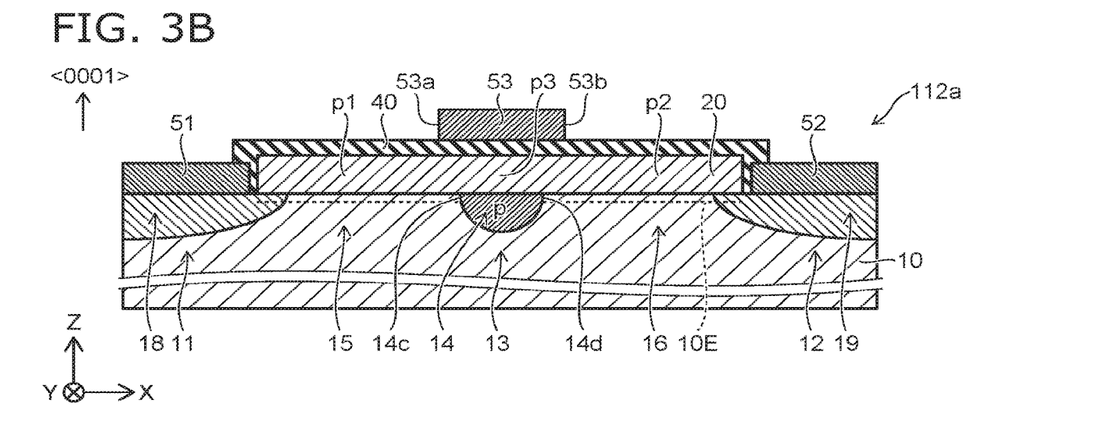
Figure 3C:
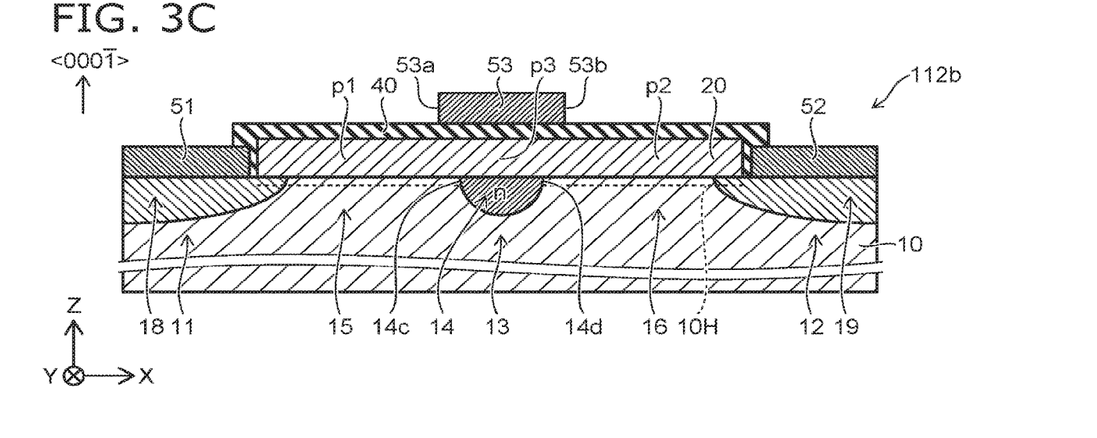

FIG. 3A to FIG. 3C are schematic cross-sectional views illustrating semiconductor devices according to the first embodiment.

As shown in FIG. 3A to FIG. 3C, semiconductor devices 112, 112a, and 112b according to the first embodiment also include the first electrode 51, the second electrode 52, the third electrode 53, the first layer 10, the second layer 20, and the insulating portion 40. In the semiconductor devices 112, 112a, and 112b, the first layer further includes an eighth partial region 18 and a ninth partial region 19 in addition to the first to sixth partial regions 11 to 16. Otherwise, the configurations of these semiconductor devices are similar to the configurations of the semiconductor devices 110, 110a, and 110b. Examples of the eighth partial region 18 and the ninth partial region 19 will now be described.

The eighth partial region 18 is provided between the first partial region 11 and the first electrode 51 in the second direction (e.g., the Z-axis direction). The concentration of a second impurity in the eighth partial region 18 is higher than the concentration of the second impurity in the fifth partial region 15. The conductivity type of the second impurity is different from the conductivity type of the first impurity.

For example, in the example of the semiconductor device 112a shown in FIG. 3B, the first impurity is of the p-type. In such a case, the second impurity is of the n-type.

For example, in the example of the semiconductor device 112b shown in FIG. 3C, the first impurity is of the n-type. In such a case, the second impurity is of the p-type.

Thus, the fourth partial region 14 is of one of the first conductivity type or the second conductivity type. In such a case, the eighth partial region 18 is of the other of the first conductivity type or the second conductivity type.

The first electrode 51 and the fifth partial region 15 where the carrier region 10C is formed are electrically connected by such an eighth partial region 18.

The ninth partial region 19 is provided between the second partial region 12 and the second electrode 52 in the second direction (e.g., the Z-axis direction). The concentration of the second impurity in the ninth partial region 19 is higher than the concentration of the second impurity in the sixth partial region 16.

For example, in the example of the semiconductor device 112a shown in FIG. 3B, the first impurity is of the p-type. In such a case, the second impurity is of the n-type.

For example, in the example of the semiconductor device 112b shown in FIG. 3C, the first impurity is of the n-type. In such a case, the second impurity is of the p-type.

Thus, the fourth partial region 14 is of one of the first conductivity type or the second conductivity type. In such a case, the ninth partial region 19 is of the other of the first conductivity type or the second conductivity type.

The second electrode 52 and the sixth partial region 16 where the carrier region 10C is formed are electrically connected by such a ninth partial region 19.

Figure 4A:
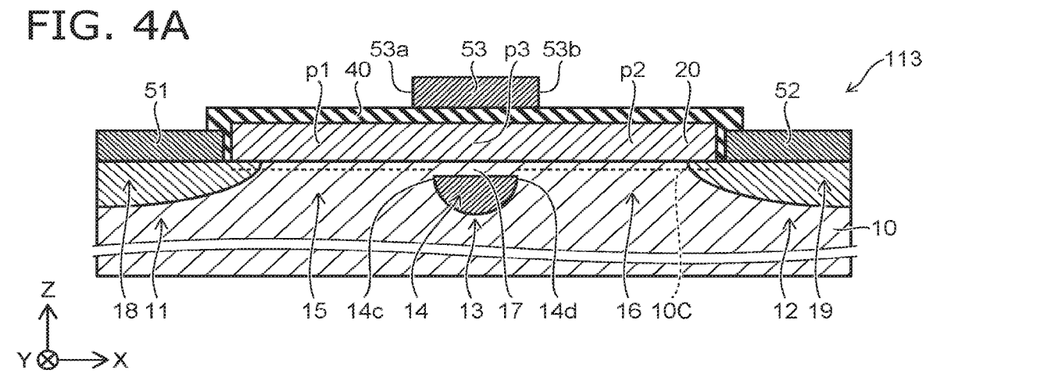
FIG. 4A to FIG. 4C are schematic cross-sectional views illustrating semiconductor devices according to the first embodiment.
Figure 4B:
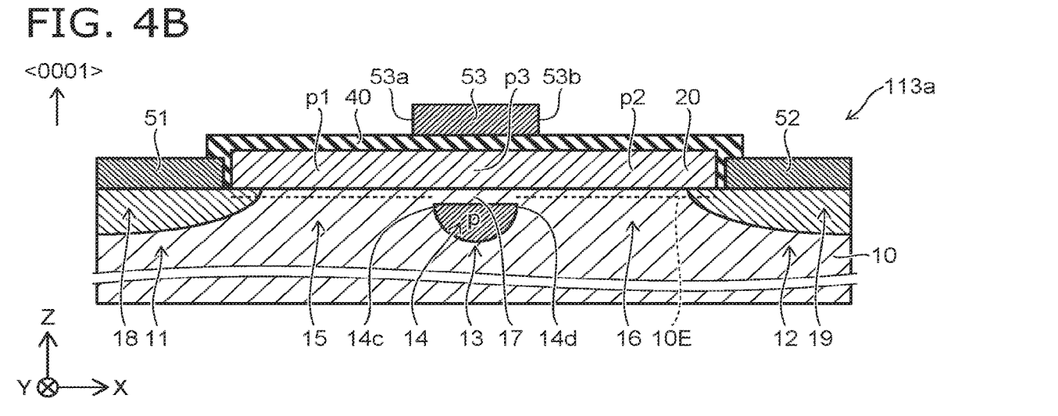
Figure 4C:
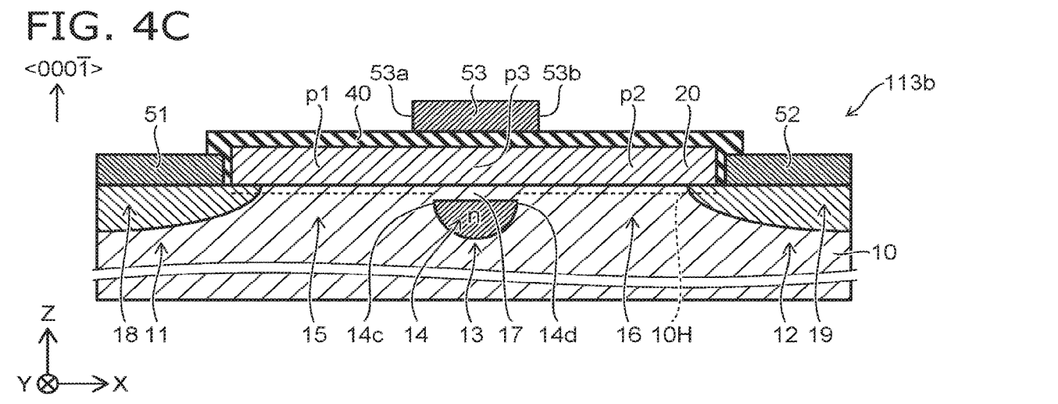
Figure 5A:
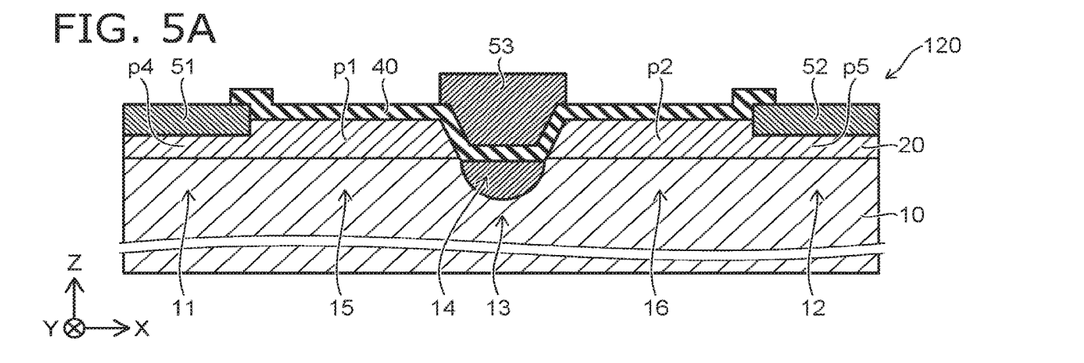
FIG. 5A and FIG. 5B are schematic cross-sectional views illustrating semiconductor devices according to a second embodiment.
Figure 5B:
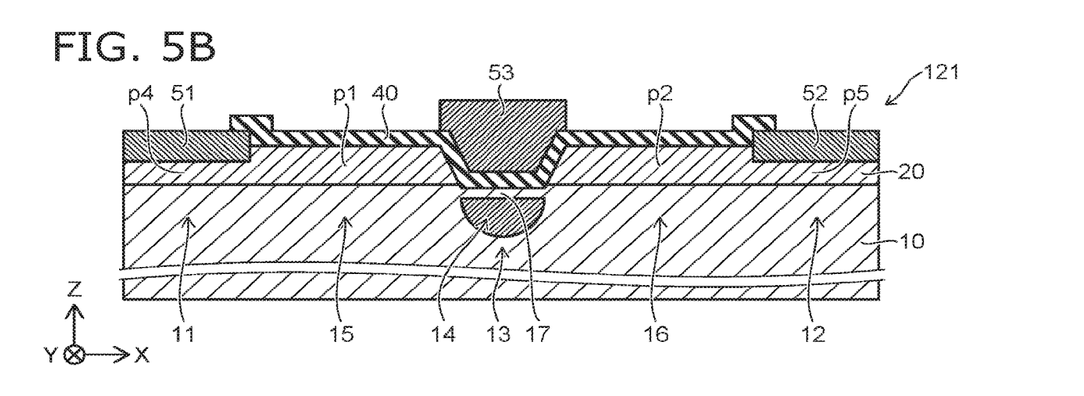
Figure 6A:
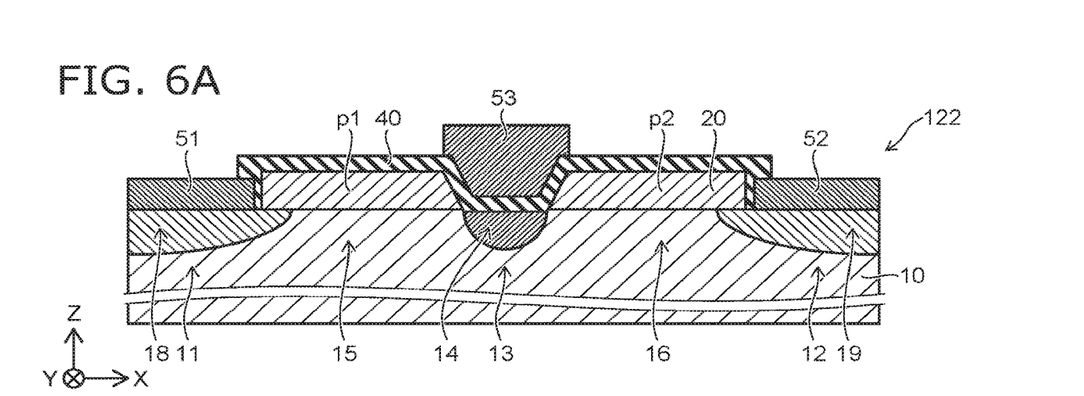
FIG. 6A and FIG. 6B are schematic cross-sectional views illustrating semiconductor devices according to a second embodiment.
Figure 6B:
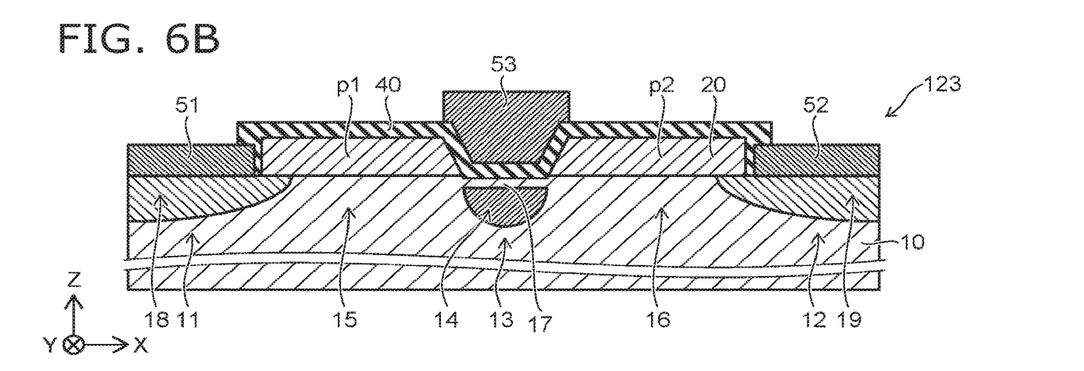
Figure 7A:
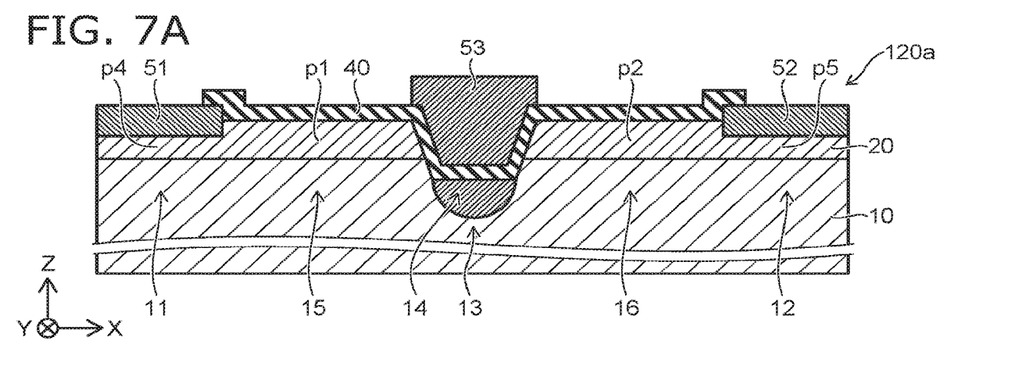
FIG. 7A and FIG. 7B are schematic cross-sectional views illustrating semiconductor devices according to the second embodiment.
Figure 7B:
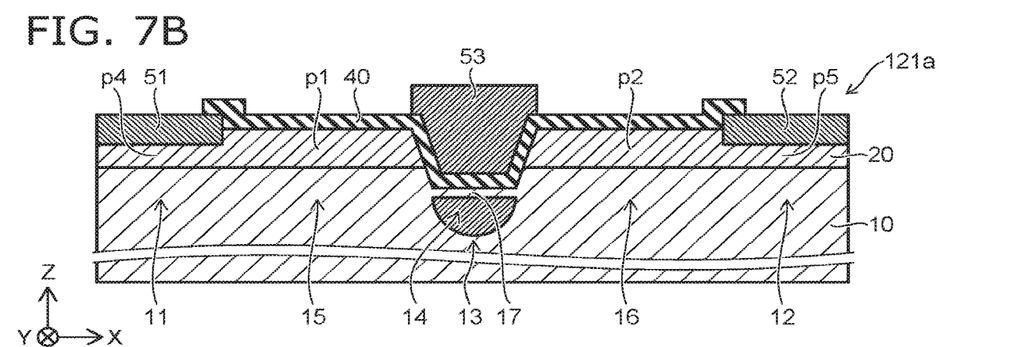
Figure 8A:
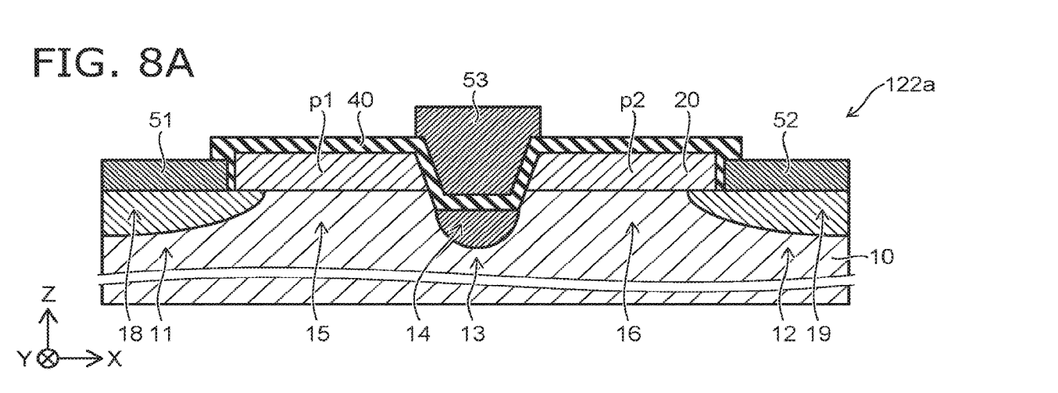
FIG. 8A and FIG. 8B are schematic cross-sectional views illustrating semiconductor devices according to the second embodiment
Figure 8B:
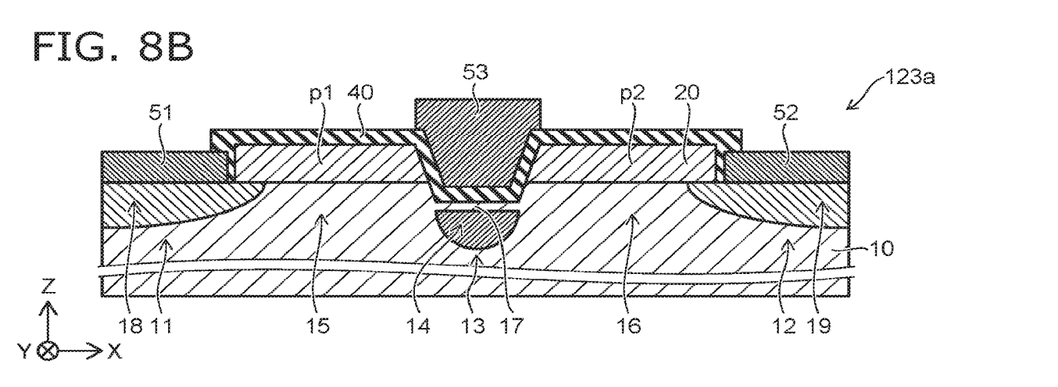

FIG. 4A to FIG. 4C are schematic cross-sectional views illustrating semiconductor devices according to the first embodiment.

As shown in FIG. 4A to FIG. 4C, semiconductor devices 113, 113a, and 113b according to the first embodiment also include the first electrode 51, the second electrode 52, the third electrode 53, the first layer 10, the second layer 20, and the insulating portion 40. In the semiconductor devices 113, 113a, and 113b, the first layer further includes the seventh partial region 17, the eighth partial region 18, and the ninth partial region 19 in addition to the first to sixth partial regions 11 to 16.

In the semiconductor devices 111 to 113, 111a to 113a, and 111b to 113b as well, the threshold voltage is moderately high. A normally-OFF operation is obtained. A high mobility is obtained. A semiconductor device can be provided in which the characteristics can be improved.

Second Embodiment

FIG. 5A, FIG. 5B, FIG. 6A, and FIG. 6B are schematic cross-sectional views illustrating semiconductor devices according to a second embodiment.

In semiconductor devices 120, 121, 122, and 123, at least a portion of the third electrode 53 is between the first portion p1 and the second portion p2 in the first direction (the X-axis direction). Otherwise, for example, the configurations are respectively the same as the configurations of the semiconductor devices 110, 111, 112, and 113.

FIG. 7A, FIG. 7B, FIG. 8A, and FIG. 8B are schematic cross-sectional views illustrating semiconductor devices according to the second embodiment.

In semiconductor devices 120a, 121a, 122a, and 123a, at least a portion of the third electrode 53 may be between the fifth partial region 15 and the sixth partial region 16 in the first direction (the X-axis direction). Otherwise, for example, the configurations are respectively the same as the configurations of the semiconductor devices 110, 111, 112, and 113.

For example, the semiconductor devices 120, 121, 122, 123, 120a, 121a, 122a, and 123a are the trench-gate type. In these semiconductor devices as well, the threshold voltage is moderately high. A normally-OFF operation is obtained. A high mobility is obtained. A semiconductor device can be provided in which the characteristics can be improved.

Such a trench gate structure (recessed structure) is applicable as necessary. For example, even in a structure that is not a trench gate, the carrier concentration can be adjusted by the thickness of the second layer 20. Thereby, the threshold voltage can be controlled to be the desired value.

In the embodiment, the first electrode 51 has an ohmic contact with a portion of the first layer 10. Or, the first electrode 51 may have an ohmic contact with a portion of the second layer 20. The second electrode 52 has an ohmic contact with another portion of the first layer 10. Or, the second electrode 52 may have an ohmic contact with another portion of the second layer 20.

An example of a method for manufacturing the semiconductor device according to the embodiments will now be described.

A semiconductor layer that is used to form the first layer 10 is prepared. The first impurity is introduced to a portion of the semiconductor layer. For example, the introduction of the first impurity is performed by ion implantation. The fourth partial region 14 is formed thereby. Subsequently, the second layer 20 is formed. For example, epitaxial growth is performed. Subsequently, by forming the insulating portion 40 and the first to third electrodes 51 to 53, the semiconductor device according to the embodiments (e.g., the semiconductor device 110 or the like) is obtained.

In the description recited above, the seventh partial region 17 may be formed by regrowth after forming the fourth partial region 14. The semiconductor device 111 or the like is obtained thereby.

In the description recited above, the eighth partial region 18 and the ninth partial region 19 are formed by introducing the second impurity in addition to the introduction of the first impurity. Thereby, for example, the semiconductor device 112 or 113 or the like is obtained.

In the embodiments recited above, for example, the second layer 20 can be formed by at least one selected from the group consisting of MOCVD (metal-organic chemical vapor deposition), molecular beam epitaxy (MBE), hydride vapor phase epitaxy (HYPE), sputtering, atomic layer deposition, and pulsed laser deposition.

In the embodiments recited above, the absolute value of the angle difference between the second direction (e.g., the Z-axis direction) and the <0001> direction or the <000-1> direction of the second layer 20 is, for example, 8 degrees or less. The <0001> direction or the <000-1> direction may be parallel to the second direction (e.g., the Z-axis direction). The <0001> direction or the <000-1> direction may be tilted at an angle of 8 degrees or less from the second direction. For example, the absolute value of the angle between the surface on the first layer 10 side of the second layer 20 and the <0001> direction or the <000-1> direction of the second layer 20 is not less than 82 degrees and not more than 98 degrees. At such an angle, the carriers that are based on the spontaneous polarization of the crystal of the second layer 20 are generated efficiently in the first layer 10. The surface on the first layer 10 side of the second layer 20 may be substantially parallel to the (0001) plane or the (000-1) plane of the second layer 20.

According to the embodiments, a semiconductor device can be provided in which the characteristics can be improved.

In this specification, the "state of being electrically connected" includes the state in which multiple conductive bodies are physically in contact, and a current flows between the multiple conductive bodies. The "state of being electrically connected" includes the state in which another conductive body is inserted between multiple conductive bodies, and a current flows between the multiple conductive bodies.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as layers, regions, electrodes, insulating portions, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a first electrode;
a second electrode, a direction from the first electrode toward the second electrode being aligned with a first direction;

a third electrode, a position in the first direction of the third electrode being between a position in the first direction of the first electrode and a position in the first direction of the second electrode;

a first layer including at least one selected from the group consisting of silicon carbide, silicon, carbon, and germanium, the first layer including first to sixth partial regions, a direction from the first partial region toward the first electrode, a direction from the second partial region toward the second electrode, and a direction from the third partial region toward the third electrode being aligned with a second direction crossing the first direction, the fourth partial region being between the third partial region and the third electrode in the second direction, a position in the first direction of the fifth partial region being between a position in the first direction of the first partial region and a position in the first direction of the fourth partial region, a position in the first direction of the sixth partial region being between the position in the first direction of the fourth partial region and a position in the first direction of the second partial region, a concentration of a first impurity in the fourth partial region being higher than a concentration of the first impurity in the fifth partial region and higher than a concentration of the first impurity in the sixth partial region; and a second layer including $Al_xGa_{1-x}N$ ($0<x\leq1$), the second layer including a first portion and a second portion, a direction from the fifth partial region toward the first portion and a direction from the sixth partial region toward the second portion being aligned with the second direction.

2. The device according to claim 1, wherein
the concentration of the first impurity in the fifth partial region is $1\times10^{15}$ cm$^{-3}$ or less, and
the concentration of the first impurity in the sixth partial region is $1\times10^{15}$ cm$^{-3}$ or less.

3. The device according to claim 1, wherein the concentration of the first impurity in the fourth partial region is $1\times10^{16}$ cm$^{-3}$ or more.

4. The device according to claim 1, wherein the concentration of the first impurity in the fourth partial region is higher than a concentration of the first impurity in the third partial region.

5. The device according to claim 1, wherein
an orientation from the fifth partial region toward the first portion is aligned with a <0001> direction of the second layer, and
the first impurity includes at least one selected from the group consisting of B, Al, and Ga.

6. The device according to claim 1, wherein
an orientation from the fifth partial region toward the first portion is aligned with a <000-1> direction of the second layer, and
the first impurity includes at least one selected from the group consisting of N, P, and As.

7. The device according to claim 1, wherein the first layer further includes a seventh partial region provided between the fourth partial region and the third electrode in the second direction.

8. The device according to claim 7, wherein a concentration of the first impurity in the seventh partial region is lower than the concentration of the first impurity in the fourth partial region.

9. The device according to claim 1, wherein the second layer further includes a fourth portion provided between the first partial region and the first electrode in the second direction.

10. The device according to claim 1, wherein
the first layer further includes an eighth partial region provided between the first partial region and the first electrode in the second direction,
a concentration of a second impurity in the eighth partial region is higher than a concentration of the second impurity in the fifth partial region,
the fourth partial region is of one of a first conductivity type or a second conductivity type, and
the eighth partial region is of the other of the first conductivity type or the second conductivity type.

11. The device according to claim 1, wherein
the first layer further includes a ninth partial region provided between the second partial region and the second electrode in the second direction,
a concentration of the second impurity in the ninth partial region is higher than a concentration of the second impurity in the sixth partial region,
the fourth partial region is of one of a first conductivity type or a second conductivity type, and
the ninth partial region is of the other of the first conductivity type or the second conductivity type.

12. The device according to claim 1, wherein the second layer further includes a fifth portion provided between the second partial region and the second electrode in the second direction.

13. The device according to claim 1, wherein
the third electrode includes a first end portion and a second end portion, a position in the first direction of the first end portion being between the position in the first direction of the first electrode and a position in the first direction of the second end portion,
the fourth partial region includes a third end portion and a fourth end portion, a position in the first direction of the third end portion being between the position in the first direction of the first electrode and a position in the first direction of the fourth end portion,
the position in the first direction of the first end portion is between the position in the first direction of the first electrode and the position in the first direction of the third end portion, and
the position in the first direction of the second end portion is between the position in the first direction of the second electrode and the position in the first direction of the fourth end portion.

14. The device according to claim 1, wherein
the second layer further includes a third portion, and
the third portion is between the fourth partial region and the third electrode in the second direction.

15. The device according to claim 14, further comprising an insulating portion provided between the third portion and the third electrode.

16. The device according to claim 1, wherein at least a portion of the third electrode is between the first portion and the second portion in the first direction.

17. The semiconductor device according to claim 1, wherein at least a portion of the third electrode is between the fifth partial region and the sixth partial region in the first direction.

18. The device according to claim 1, wherein x is 0.5 or more.

19. The device according to claim 1, wherein
the first portion contacts the fifth partial region, and the second portion contacts the sixth partial region.

20. The device according to claim 1, wherein a crystallinity in the fourth partial region is lower than a crystallinity in the fifth partial region and lower than a crystallinity in the sixth partial region.

* * * * *